(12) United States Patent
Miyoshi et al.

(10) Patent No.: US 8,378,386 B2
(45) Date of Patent: Feb. 19, 2013

(54) EPITAXIAL SUBSTRATE FOR SEMICONDUCTOR DEVICE, SEMICONDUCTOR DEVICE, AND METHOD OF MANUFACTURING EPITAXIAL SUBSTRATE FOR SEMICONDUCTOR DEVICE

(75) Inventors: Makoto Miyoshi, Nagoya (JP); Yoshitaka Kuraoka, Nagoya (JP); Shigeaki Sumiya, Nagoya (JP); Mikiya Ichimura, Nagoya (JP); Tomohiko Sugiyama, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 323 days.

(21) Appl. No.: 12/853,716

(22) Filed: Aug. 10, 2010

(65) Prior Publication Data
US 2011/0049570 A1   Mar. 3, 2011

(30) Foreign Application Priority Data

Aug. 28, 2009 (JP) .................. 2009-198381

(51) Int. Cl.
*H01L 29/778* (2006.01)
(52) U.S. Cl. ............ 257/192; 257/E29.93; 438/172
(58) Field of Classification Search .......... 257/192, 257/E29.093; 438/172
See application file for complete search history.

(56) References Cited

U.S. PATENT DOCUMENTS

| 7,170,111 B2 * | 1/2007 | Saxler ................ 257/194 |
| 2006/0043396 A1 * | 3/2006 | Tsuda et al. ............ 257/94 |
| 2009/0045438 A1 * | 2/2009 | Inoue et al. ............ 257/192 |
| 2010/0193839 A1 * | 8/2010 | Takatani ............ 257/192 |

FOREIGN PATENT DOCUMENTS

| EP | 2 003 686 A2 | 12/2008 |
| JP | 2003-229439 A1 | 8/2003 |
| WO | 97/15079 A1 | 4/1997 |

OTHER PUBLICATIONS

Toshihide Kildcawa, "*Highly Reliable 250 W High Electron Mobility Transistor Power Amplifier*," Japanese Journal of Applied Physics, vol. 44, No. 7A, 2005, pp. 4896-4901.
Stacia Keller, et al., "*Gallium Nitride Based High Power Heterojunction Field Effect Transistors: Process Development and Present Status at USCB*," IEEE Trans. Electron Devices, vol. 48, No. 3, Mar. 2001, pp. 552-559.
F. Medjdoub, et al., "*Can InAlN/GaN Be an Alternative to High Power/High Temperature AlGaN/GaN Devices?*," IEEE IEDM Tech. Digest, 2006, pp. 673-676.
Remziye Tulek et al., "*Comparison of the Transport Properties of High Quality AlGaN/AlN/GaN and AllnN/AlN/GaN Two-Dimensional Electron Gas Heterostructures*," Journal of Applied Physics, vol. 105, No. 1, Jan. 7, 2009, pp. 13707-1-13707-7.
Extended European Search Report dated Aug. 16, 2012.

* cited by examiner

Primary Examiner — Steven J Fulk
(74) Attorney, Agent, or Firm — Burr & Brown

(57) ABSTRACT

Provided is an epitaxial substrate capable of achieving a semiconductor device that has excellent ohmic contact characteristics as well as satisfactory device characteristics. On a base substrate, a channel layer formed of a first group III nitride that contains at least Al and Ga and has a composition of $In_{x1}Al_{y1}Ga_{z1}N$ (x1+y1+z1=1) is formed. On the channel layer, a barrier layer formed of a second group III nitride that contains at least In and Al and has a composition of $In_{x2}Al_{y2}Ga_{z2}N$ (x2+y2+z2=1) is formed such that an In composition ratio of a near-surface portion is larger than an In composition ratio of a portion other than the near-surface portion.

13 Claims, 7 Drawing Sheets

F I G . 1
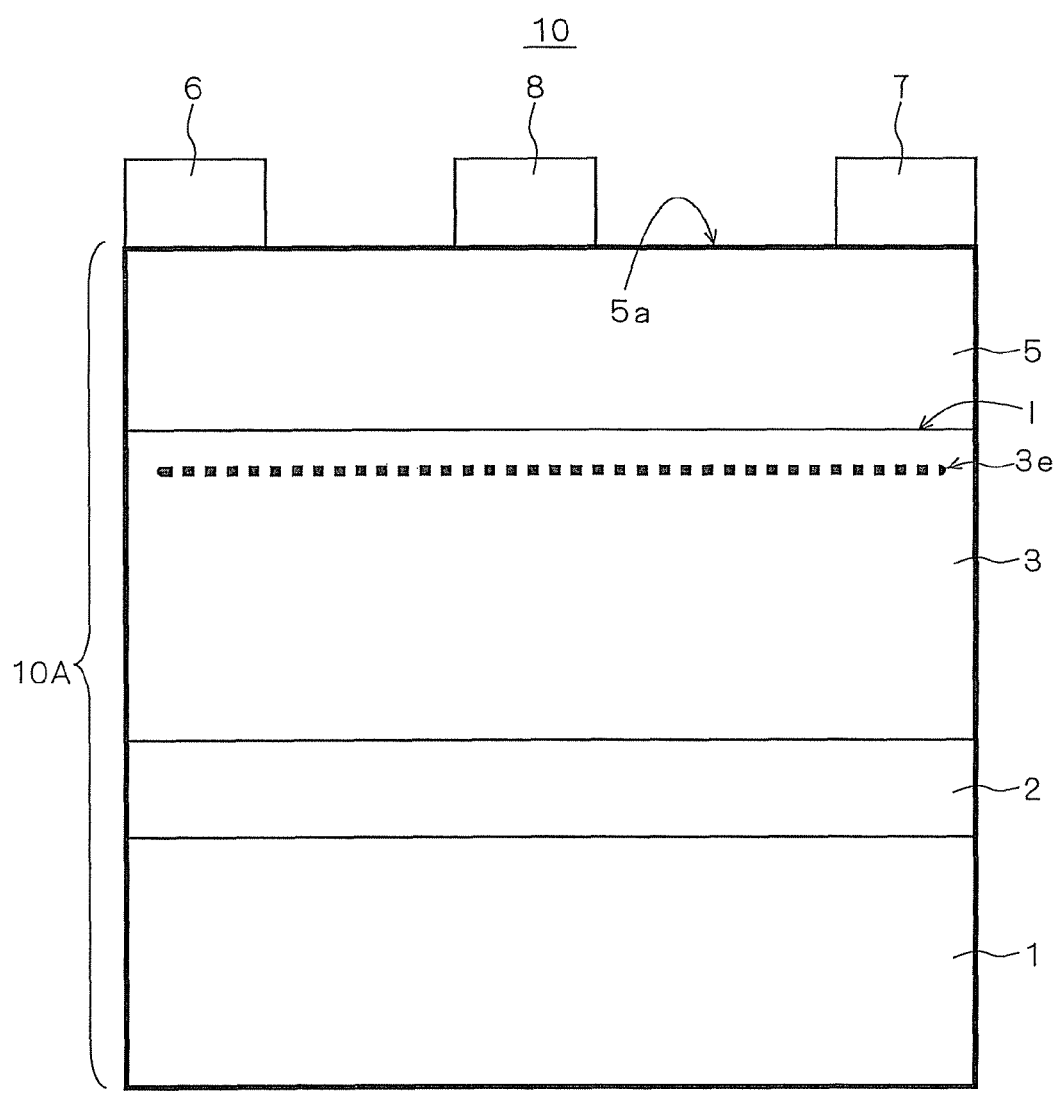

F I G . 2
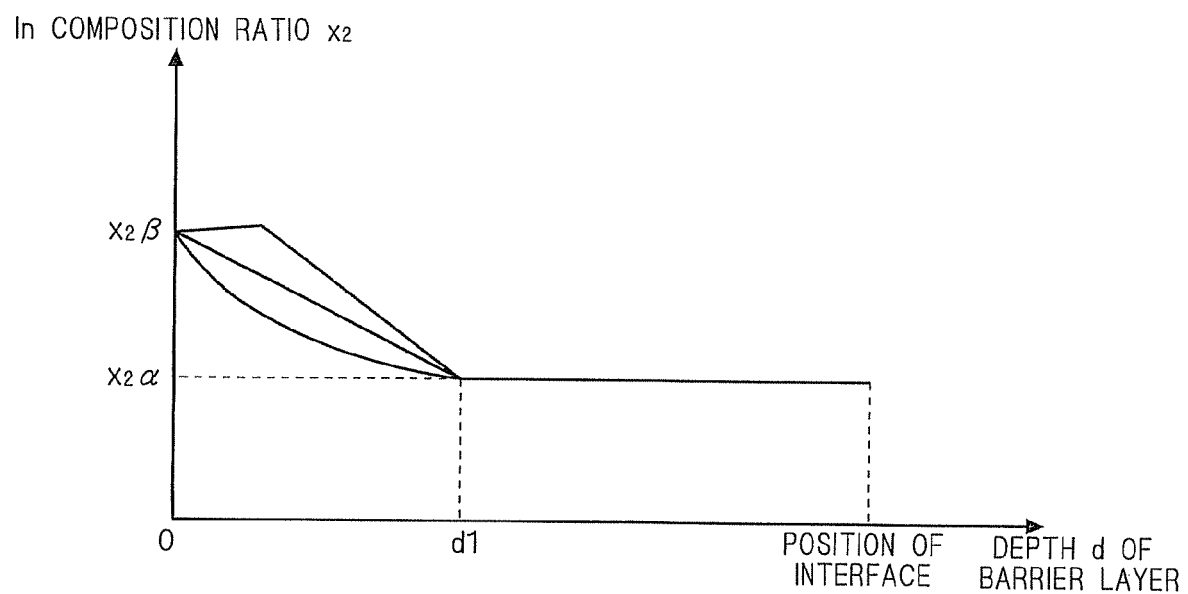

FIG. 9

| SAMPLE NO. | In COMPOSITION RATIO ON SURFACE x2β | GRADING RATE x2β/x2α | SHEET RESISTANCE (Ω/□) | CONTACT RESISTANCE (Ω·cm²) |
|---|---|---|---|---|
| 1 | 0.171 | 1.07 | 195 | 4.20E-06 |
| 2 | 0.174 | 1.09 | 196 | 4.40E-06 |
| 3 | 0.170 | 1.06 | 193 | 4.50E-06 |
| 4 | 0.164 | 1.03 | 192 | 1.00E-05 |
| 5 | 0.160 | 1.00 | 192 | 1.10E-05 |
| 6 | 0.182 | 1.13 | 223 | 8.50E-05 |

FIG. 10

| COMPOSITION OF BARRIER LAYER BASE PORTION | | | CONTACT RESISTANCE (Ω·cm²) | |
|---|---|---|---|---|
| In x2α | Al y2α | Ga z2α | COMPARATIVE EXAMPLE (WITHOUT COMPOSITION GRADIENT) | INVENTIVE EXAMPLE (WITH COMPOSITION GRADIENT) |
| 0.17 | 0.83 | 0 | 1.30E-05 | 5.50E-06 |
| 0.16 | 0.84 | 0 | 1.20E-05 | 4.50E-06 |
| 0.15 | 0.85 | 0 | 1.30E-05 | 4.50E-06 |
| 0.14 | 0.86 | 0 | 1.10E-05 | 3.50E-06 |
| 0.13 | 0.87 | 0 | 1.10E-05 | 4.50E-06 |
| 0.12 | 0.88 | 0 | 1.10E-05 | 4.80E-06 |
| 0.15 | 0.75 | 0.1 | 1.00E-05 | 5.40E-06 |
| 0.13 | 0.77 | 0.1 | 1.20E-05 | 3.80E-06 |
| 0.11 | 0.79 | 0.1 | 1.20E-05 | 8.00E-06 |
| 0.13 | 0.67 | 0.2 | 1.10E-05 | 6.30E-06 |
| 0.12 | 0.68 | 0.2 | 1.10E-05 | 5.50E-06 |
| 0.11 | 0.69 | 0.2 | 1.10E-05 | 5.20E-06 |
| 0.09 | 0.71 | 0.2 | 1.00E-05 | 6.60E-06 |
| 0.115 | 0.585 | 0.3 | 1.20E-05 | 6.10E-06 |
| 0.1 | 0.6 | 0.3 | 1.20E-05 | 4.50E-06 |
| 0.09 | 0.61 | 0.3 | 1.10E-05 | 4.50E-06 |
| 0.07 | 0.63 | 0.3 | 1.10E-05 | 6.00E-06 |

EPITAXIAL SUBSTRATE FOR SEMICONDUCTOR DEVICE, SEMICONDUCTOR DEVICE, AND METHOD OF MANUFACTURING EPITAXIAL SUBSTRATE FOR SEMICONDUCTOR DEVICE

BACKGROUND OF THE INVENTION

1. Field of the Invention

The present invention relates to an epitaxial substrate that has a multi-layer structure composed of a group III nitride semiconductor, and more particularly, to a multi-layer structured epitaxial substrate for electronic devices and a method of manufacturing the same.

2. Description of the Background Art

Nitride semiconductors having high breakdown electric field and high saturation electron velocity have been attracting attention as the next generation of semiconductor materials for high-frequency/high-power devices. For example, a high electron mobility transistor (HEMT) device formed by laminating a barrier layer composed of AlGaN and a channel layer composed of GaN takes advantage of the feature that high-concentration two-dimensional electron gas (2DEG) is generated at a lamination interface (hetero interface) owing to a polarization effect (spontaneous polarization effect and piezo polarization effect) inherent in a nitride material (for example, see "Highly Reliable 250 W High Electron Mobility Transistor Power Amplifier", Toshihide Kikkawa, Jpn. J. Appl. Phys. 44 (2005), p. 4896).

As a base substrate of the substrate for HEMT device, for example, a single crystal (heterogeneous single crystal) having a composition different from that of a group III nitride, such as silicon and SiC, is used in some cases. In this case, a buffer layer such as a strained superlattice layer and a low-temperature growth buffer layer is typically formed as an initial growth layer on the base substrate. Therefore, the most basic configuration of a substrate for HEMT device using a base substrate formed of heterogeneous single crystal is obtained by epitaxially forming a barrier layer, a channel layer and a buffer layer on a base substrate. In addition, for the purpose of accelerating spatial confinement of two-dimensional electron gas, a spacer layer having a thickness of approximately 1 nm is provided between the barrier layer and the channel layer in some cases. The spacer layer is composed of, for example, AlN. Moreover, for the purposes of controlling an energy level on the topmost surface of the substrate for HEMT device and improving contact characteristics with an electrode, for example, a cap layer composed of an n-type GaN layer or a superlattice layer is formed on the barrier layer in some cases.

In a case of a nitride HEMT device having the most typical configuration in which a channel layer is formed of GaN and a barrier layer is formed of AlGaN, it is known that the concentration of two-dimensional electron gas existing in a substrate for HEMT device increases along with an increase in AlN mole fraction of AlGaN that forms the barrier layer (for example, see "Gallium Nitride Based High Power Heterojunction Field Effect Transistors: Process Development and Present Status at USCB", Stacia Keller, Yi-Feng Wu, Giacinta Parish, Naiqian Ziang, Jane J. Xu, Bernd P. Keller, Steven P. DenBaars, and Umesh K. Mishra, IEEE Trans. Electron Devices 48 (2001), p. 552). It is conceivable that controllable current density of a HEMT device, that is, power density capable of being utilized can be improved significantly if the concentration of two-dimensional electron gas can be increased significantly.

Further, growing attention is also paid to the HEMT device that has a low dependence on the piezo polarization effect, is capable of generating two-dimensional electron gas at high concentration almost only by spontaneous polarization, and has the structure with small strains, such as the HEMT device in which a channel layer is formed of GaN and a barrier layer is formed of InAlN (for example, see "Can InAlN/GaN be an alternative to high power/high temperature AlGaN/GaN devices?", F. Medjdoub, J.-F. Carlin, M. Gonschorek, E. Feltin, M. A. Py, D. Ducatteau, C. Gaquiere, N. Grandjean, and E. Kohn, IEEE IEDM Tech. Digest in IEEE IEDM 2006, p. 673).

In order to put the above-mentioned HEMT device or a substrate for HEMT device that is a multi-layer structure used in manufacturing the same to practical use, various problems need to be solved; problems related to performance improvement such as increase of power density and efficiency, problems related to functional improvement such as achieving normally-off operation, and fundamental problems such as enhancing reliability and reducing cost. The above-mentioned problems are individually tackled vigorously.

One of the above-mentioned problems is to improve ohmic contact characteristics between a source electrode or a drain electrode and a barrier layer.

SUMMARY OF THE INVENTION

The present invention is directed to an epitaxial substrate for semiconductor device.

An epitaxial substrate for semiconductor device according to the present invention includes: a base substrate; a channel layer formed of a first group III nitride containing at least Al and Ga and having a composition of $In_{x1}Al_{y1}Ga_{z1}N$ ($x1+y1+z1=1$); and a barrier layer including a near-surface portion and a base portion, the barrier layer being formed of a second group III nitride containing at least In and Al and having a composition of $In_{x2}Al_{y2}Ga_{z2}N$ ($x2+y2+z2=1$), wherein: the near-surface portion is a portion positioned in a predetermined distance range from a surface of the barrier layer; the base portion is a portion of the barrier layer other than the near-surface portion; and an In composition ratio of a surface of the barrier layer is larger than an In composition ratio of the base portion.

Preferably, the near-surface portion is in a range of 6 nm or more from the surface of the barrier layer in a depth direction, and $1.05 \leq x2\beta/x2\alpha \leq 1.1$ where the composition of the second group III nitride in the base portion is represented by $In_{x2\alpha}Al_{y2\alpha}Ga_{z2\alpha}N$ ($x2\alpha+y2\alpha+z2\alpha=1$) and the composition of the second group III nitride in the near-surface portion is represented by $In_{x2\beta}Al_{y2\beta}Ga_{z2\beta}N$ ($x2\beta+y2\beta+z2\beta=1$).

According to the present invention, there is achieved a semiconductor device having ohmic contact characteristics between a barrier layer and an electrode being in ohmic contact therewith, which are more improved compared with a conventional case.

Therefore, an object of the present invention is to provide an epitaxial substrate for semiconductor device that is capable of achieving a semiconductor device having excellent ohmic contact characteristics and satisfactory device characteristics.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic cross-sectional view schematically showing a configuration of a HEMT device according to a first preferred embodiment;

FIG. 2 is a graph schematically showing the In compositional distribution of a barrier layer in a depth direction;

FIG. 9 is a table showing a list of evaluation results of ohmic contact characteristics of the samples according to Inventive Example 1; and FIG. 10 is a table showing a list of compositions of base portions of barrier layers of samples according to Inventive Example 2 and measurement results of contact resistances of the samples according to Inventive Example 2 and Comparative Example corresponding thereto.

DESCRIPTION OF THE PREFERRED EMBODIMENTS

First Preferred Embodiment

Configuration of HEMT Device

Figure 3:
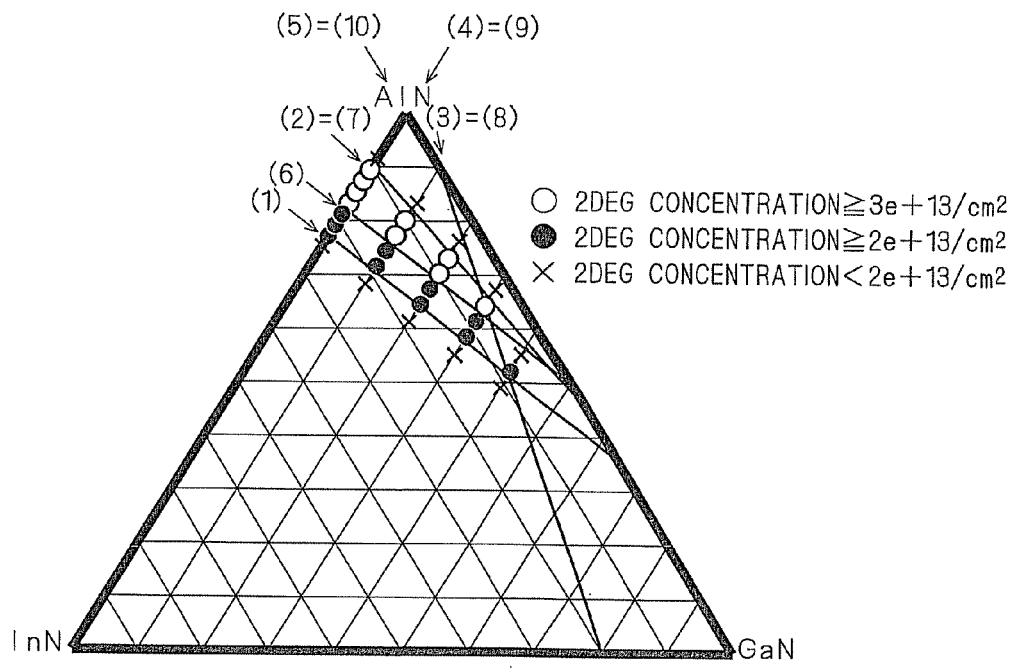
FIG. 3 is a diagram in which the relationship between a two-dimensional electron gas concentration and a composition of the barrier layer is mapped on a ternary phase diagram with three components of InN, AlN and GaN being vertices.

FIG. 1 is a schematic cross-sectional view schematically showing the configuration of a HEMT device 10 according to a first preferred embodiment of the present invention. The HEMT device 10 has the configuration in which a substrate 1, a buffer layer 2, a channel layer 3 and a barrier layer 5 are formed by lamination. The buffer layer 2, the channel layer 3 and the barrier layer 5 are preferred examples of layers that are epitaxially formed (details thereof are described below) using the metal organic chemical vapor deposition method (MOCVD method). Hereinbelow, the laminated structure formed by laminating the substrate 1, the buffer layer 2, the channel layer 3 and the barrier layer 5 is also referred to as an epitaxial substrate 10A. Note that ratios of respective layers in FIG. 1 do not reflect actual ones.

Hereinbelow, while description is given of a case where the MOCVD method is used for the formation of each layer, other epitaxial growth technique, for example, the method appropriately selected from various vapor phase growth methods and liquid phase growth methods such as MBE, HYPE and LPE may be used, as long as it is the technique capable of forming each layer for providing excellent crystallinity. Alternatively, different growth methods may be used in combination.

Any substrate may be used as the substrate 1 as long as a nitride semiconductor layer having excellent crystallinity can be formed thereon, without any particular limitation. A 6H—SiC single crystal substrate is preferably used as an example, and a substrate composed of sapphire, Si, GaAs, spinel, MgO, ZnO, ferrite or the like may be used.

The buffer layer 2 is formed of AlN to have a thickness of approximately several hundreds of nm, for making crystal quality of the channel layer 3 and the barrier layer 5 that are formed thereon excellent. For example, the buffer layer 2 is preferably formed to have a thickness of 200 nm.

The channel layer 3 is formed of a group III nitride having a composition of $In_{x1}Al_{y1}Ga_{z1}N$ (x1+y1+z1=1) so as to have a thickness of approximately several μm. In this preferred embodiment, the channel layer 3 is formed so as to satisfy a composition range of x1=0 and $0 \leq y1 \leq 0.3$. In the case where $0.3 < y1 \leq 1$, the crystallinity of the channel layer 3 itself deteriorates remarkably, which makes it difficult to obtain the epitaxial substrate 10A and besides, the HEMT device 10 having excellent electrical characteristics.

On the other hand, the barrier layer 5 is formed of a group III nitride having a composition of $In_{x2}Al_{y2}Ga_{z2}N$ (where x2+y2+z2=1) so as to have a thickness of several nm to several tens of nm. The barrier layer 5 is described below in detail.

In the HEMT device 10, a source electrode 6, a drain electrode 7 and a gate electrode 8 are further provided on the barrier layer 5. The source electrode 6 and the drain electrode 7 are multi-layer metal electrodes formed of Ti/Al/Ni/Au each having thickness of approximately ten and several nm to hundred and several tens of nm. The source electrode 6 and the drain electrode 7 have ohmic contact with the barrier layer 5. On the other hand, the gate electrode 8 is a multi-layer metal electrode formed of Pd/Au each having thickness of approximately ten and several nm to hundred and several tens of The gate electrode 8 has schottky contact with the barrier layer 5. Note that the metal used for the source electrode 6 and the drain electrode 7 is not limited to the multi-layer metal formed of Ti/Al/Ni/Au as long as excellent ohmic contact can be obtained with respect to the semiconductor epitaxial substrate according to the present invention and, for example, Ti/Al/Pt/Au or Ti/Al can be used. Similarly, the metal used for the gate electrode 8 is not limited to Pd/Au as long as excellent schottky contact can be obtained with respect to the semiconductor epitaxial substrate according to the present invention and, for example, Pd/Ti/Au or Ni/Au can be used.

In the HEMT device 10 having the above-mentioned layer configuration (in the epitaxial substrate 10A), an interface I between the channel layer 3 and the barrier layer 5 becomes a heterojunction interface, and thus a two-dimensional electron gas region 3e in which two-dimensional electron gas is present at high concentration is formed at the interface I (more specifically, at the portion of the channel layer 3 in the vicinity of the interface) by the spontaneous polarization effect and piezo polarization effect. Note that in order to generate two-dimensional electron gas, the formation is made such that the interface I has a mean roughness within a range of 0.1 nm to 3 nm and a surface of the barrier layer 5 for forming the interface I has a mean square roughness within a range of 0.1 nm to 3 nm. Note that a flat interface may be formed exceeding the above-mentioned range, which is not practical considering cost and manufacturing yield. Preferably, the formation is made such that the interface I has a mean roughness within a range of 0.1 nm to 1 nm and the surface of the barrier layer 5 has a mean square roughness within a range of 0.1 nm to 1 nm in a field of view of 5 μm×5 μm. In such a case, more excellent ohmic characteristics are obtained between the source electrode 6 or the drain electrode 7 and the barrier layer 5, and more excellent schottky characteristics are obtained between the gate electrode 8 and the barrier layer 5. Moreover, the effect of confining two-dimensional electron gas is enhanced further, whereby two-dimensional electron gas having higher concentration is generated.

Barrier Layer

In the HEMT device 10 according to this preferred embodiment, the barrier layer 5 is formed so as to have a gradient composition but not to have a uniform composition in a depth direction (thickness direction) from a surface 5a.

FIG. 2 is a graph schematically showing the distribution of the In composition ratio of the barrier layer 5 in the depth direction. As shown in FIG. 2, the barrier layer 5 has a uniform In composition ratio x2 from a portion (hereinbelow, also referred to as a base portion) apart from the surface in the depth direction by a distance d1 or more to a position of the interface I. Note that the distance d1 may be appropriately determined in accordance with the thickness of the barrier layer 5, which is at least 6 nm or more. The base portion is formed of a group III nitride having a composition of $In_{x2\alpha}Al_{y2\alpha}Ga_{z2\alpha}N$ (where $x2\alpha+y2\alpha+z2\alpha=1$). To the contrary, the surface 5a of the barrier layer 5 is formed of a group III nitride that has an In composition ratio x2 of $x2\beta$ larger than $x2\alpha$ and has a composition of $In_{x2\beta}Al_{y2\beta}Ga_{z2\beta}N$ (where $x2\beta+y2\beta+z2\beta=1$). Preferably, $1.05 \leq x2\beta/x2\alpha \leq 1.1$. In a range where the depth is less than the distance d1 from the surface 5a (hereinbelow, also referred to as a near-surface portion), the In composition ratio x2 has different values in accordance with the distance d while changing continuously.

That is, in the barrier layer 5, the In composition ratio in the near-surface portion is larger than the In composition ratio in the portion (that is, base portion) other than the near-surface portion. In this preferred embodiment, as to the distribution of the In composition ratio as described above, the barrier layer 5 is referred to have a gradient composition in the range where the barrier layer 5 is apart from the surface 5a by zero to the distance d1, including the case where the In composition ratio may take an In composition ratio larger than $x2\beta$ in the near-surface portion. Further, the ratio $x2\beta/x2\alpha$ is also referred to as a grading rate.

Note that it is possible to form the barrier layer 5 having the gradient composition in the near-surface portion by appropriately adjusting a susceptor temperature and a flow amount of source gas in forming the barrier layer 5.

In the HEMT device 10 according to this preferred embodiment, where the barrier layer 5 has the above-mentioned gradient composition, the ohmic contact characteristics between the source electrode 6 or the drain electrode 7 and the barrier layer 5 are more improved compared with a conventional case. For example, there is achieved a HEMT device whose contact resistance is reduced to approximately a half of that of a conventional HEMT device that does not have the gradient composition.

Relationship between composition of channel layer and barrier layer and two-dimensional electron gas concentration When the composition of the group III nitride constituting the channel layer 3 and the barrier layer 5 is caused to satisfy a predetermined requirement, there can be achieved the HEMT device 10 that includes the two-dimensional electron gas region 3e in which two-dimensional electron gas is present at a higher concentration compared with a conventional case and has a suppressed internal stress due to strains. Specifically, two-dimensional electron gas concentration of $2 \times 10^{13}/cm^2$ or more is achieved. Note that the mobility of two-dimensional electron gas in the HEMT device 10 is approximately 300 to 400 $cm^2/Vs$.

Figure 4:
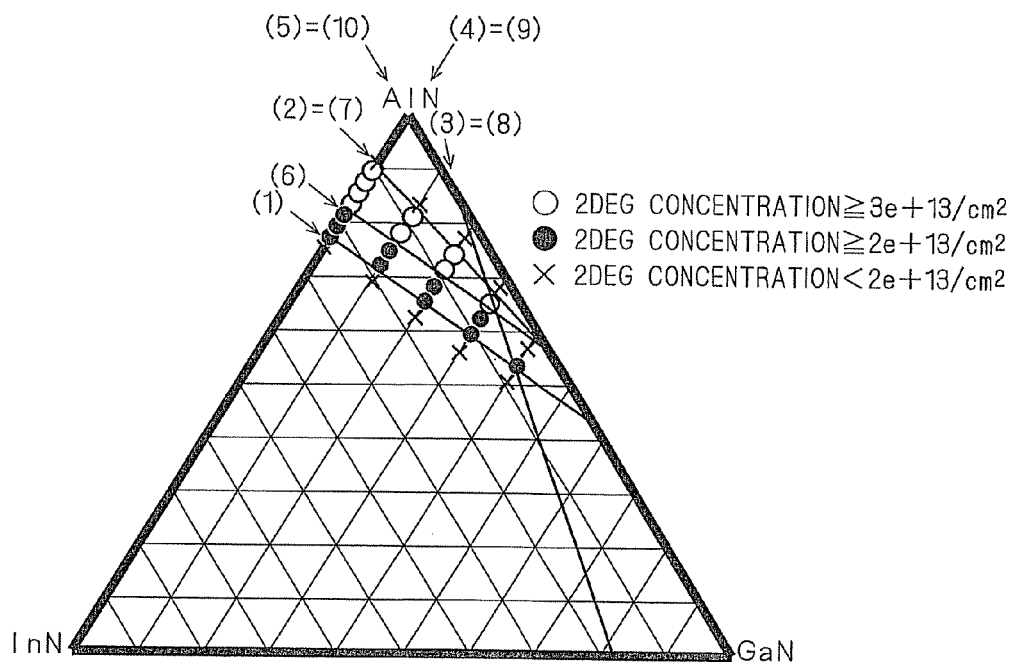
FIG. 4 is another diagram in which the relationship between a two-dimensional electron gas concentration and a composition of the barrier layer is mapped on a ternary phase diagram with three components of InN, AlN and GaN being vertices.
Figure 5:
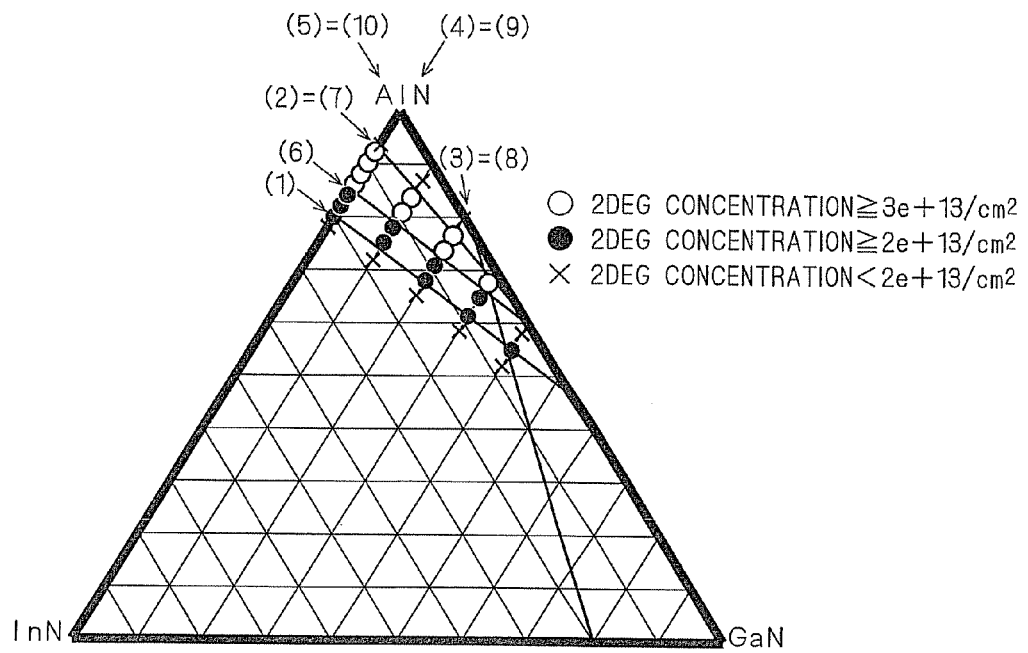
FIG. 5 is still another diagram in which the relationship between a two-dimensional electron gas concentration and a composition of the barrier layer is mapped on a ternary phase diagram with three components of InN, AlN and GaN being vertices.
Figure 6:
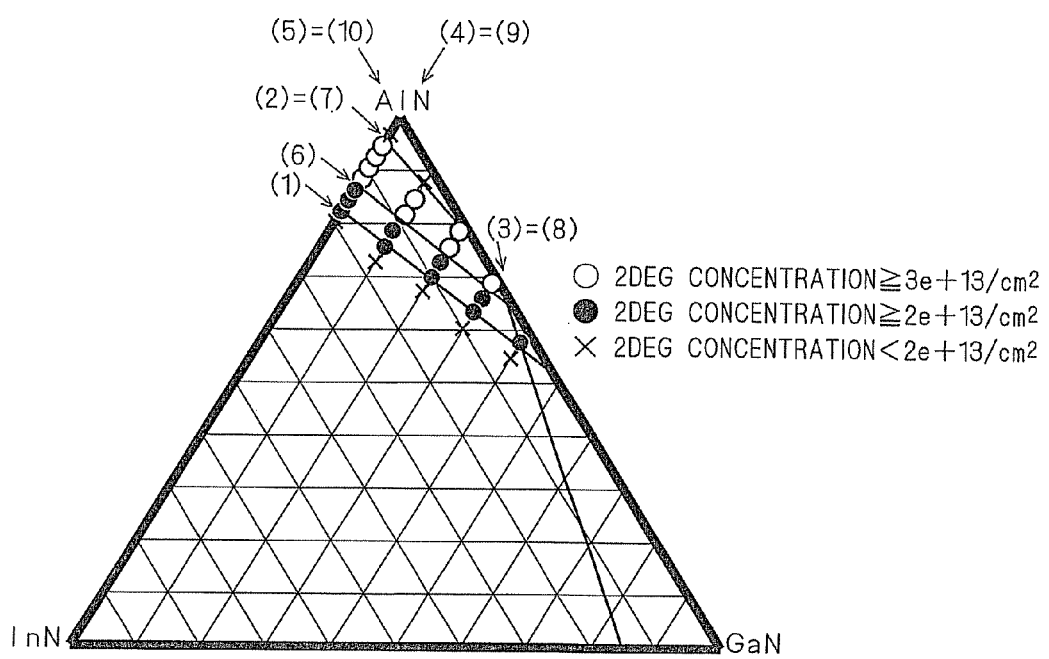
FIG. 6 is yet still another diagram in which the relationship between a two-dimensional electron gas concentration and a composition of the barrier layer is mapped on a ternary phase diagram with three components of InN, AlN and GaN being vertices.

FIGS. 3, 4, 5 and 6 are diagrams in which the relationship between the two-dimensional electron gas concentration and the composition of the barrier layer 5 is mapped on a ternary phase diagram with three components of InN, AlN and GaN being vertices. Note that for the sake of simplification of the diagrams, in FIGS. 3 to 6, mapping of data that does not affect the identification of the composition range is omitted. The composition of the channel layer 3 corresponding to each diagram is as follows:

FIG. 3: GaN (x1=y1=0, z1=1);
FIG. 4: $Al_{0.1}Ga_{0.9}N$ (x1=0, y1=0.1, z1=0.9);
FIG. 5: $Al_{0.2}Ga_{0.8}N$ (x1=0, y1=0.2, z1=0.8); and
FIG. 6: $Al_{0.3}Ga_{0.7}N$ (x1=0, y1=0.3, z1=0.7).

Mapping results shown in FIGS. 3 to 6 lead to a fact that the two-dimensional electron gas concentration in the two-dimensional electron gas region 3e is equal to or more than $2 \times 10^{13}/cm^2$ when the barrier layer 5 selects the composition in the range surrounded by five straight lines expressed by the expressions described below in the ternary phase diagrams. More specifically, it suffices that the composition at least of the base portion satisfies the composition ranges indicated by the straight lines below, and further, that the near-surface portion satisfies those composition ranges.

$$x2 = \frac{y2 - (0.36 + 0.5y1)}{1.78} = -\frac{z2 - (0.64 - 0.5y1)}{2.78} \quad (1)$$

$$x2 = \frac{y2 - (0.45 + y1)}{4.5} = -\frac{z2 - (0.55 - y1)}{5.5} \quad (2)$$

$$x2 = -\frac{y2 - (0.9 - 0.7y1)}{4.5} = -\frac{z2 - (0.1 + 0.7y1)}{3.5} \quad (3)$$

$$z2 = 0 \quad (4)$$

$$x2 = 0 \ \left(\text{where } \frac{9}{34} \leq y1 \leq 0.3\right) \quad (5)$$

Expressions (1), (2) and (3) include the composition (specifically, value of y1 when x1=0) of the channel layer 3 as a variable, which means that the composition of the barrier layer 5 in which a high two-dimensional electron gas concentration of $2 \times 10^{13}/cm^2$ or more is achieved is determined in accordance with the composition of the channel layer 3. Note that in a case where y1<9/34, the confined region is foamed by the straight lines expressed by Expressions (1) to (4), and thus the straight line expressed by Expression (5) is not relevant to defining of the composition range.

On the other hand, as to the epitaxial substrate 10A that is manufactured so as to satisfy the above-mentioned composition range, it has been confirmed from the results of X-ray diffraction measurement that the strains of the barrier layer 5 in an in-plane direction are 1% or less.

The above indicates that, in the HEMT device 10 in which the channel layer 3 and the barrier layer 5 are formed with the composition satisfying the above-mentioned composition range, the strains due to the internal stress are suppressed and the two-dimensional electron gas region 3e having a concentration of $2 \times 10^{13}/cm^2$ or more that is higher compared with a conventional case is formed at the interface I between both layers.

Further, the mapping results shown in FIGS. 3 to 6 lead to a fact that the two-dimensional electron gas concentration in the two-dimensional electron gas region 3e is $3 \times 10^{13}/cm^2$ or more when the barrier layer 5 has the composition in the range surrounded by five straight lines expressed by expressions described below in a ternary phase diagram.

$$x2 = \frac{y2 - (0.5 + 0.5y1)}{1.78} = -\frac{z2 - (0.5 - 0.5y1)}{2.78} \quad (6)$$

$$x2 = \frac{y2 - (0.45 + y1)}{4.5} = -\frac{z2 - (0.55 - y1)}{5.5} \quad (7)$$

$$x2 = -\frac{y2 - (0.9 - 0.7y1)}{4.5} = \frac{z2 - (0.1 + 0.7y1)}{3.5} \quad (8)$$

$$z2 = 0 \quad (9)$$

$$x2 = 0 \ \left(\text{where } \frac{9}{34} \leq y1 \leq 0.3\right) \quad (10)$$

Note that in the case where $y1<9/34$, the confined region is faulted by the straight lines expressed by Expressions (6) to (9), and thus the straight line expressed by Expression (10) is not relevant to defining of the composition range.

The above indicates that, in the HEMT device 10 in which the channel layer 3 and the barrier layer 5 are formed with the composition satisfying the above-mentioned composition range, the two-dimensional electron gas region 3e having a concentration of $3\times10^{13}/cm^2$ or more that is higher compared with a conventional case is formed at the interface I between both layers.

Note that the discussion regarding the above-mentioned composition range does not exclude a fact that the channel layer 3 and the barrier layer 5 contain impurities. For example, the channel layer 3 and the barrier layer 5 may contain oxygen atoms in the concentration range of 0.0005 at % ($1\times10^{17}/cm^3$) or more to 0.05 at % ($1\times10^{19}/cm^3$) or less, or may contain carbon atoms in the concentration range of 0.0010 at % ($2\times10^{17}/cm^3$) or more to 0.05 at % ($1\times10^{19}/cm^3$) or less. Note that the concentrations of oxygen atoms and carbon atoms may be smaller than respective lower limits of the above-mentioned ranges, which is not practical considering cost and manufacturing yield. On the other hand, when the concentrations of oxygen atoms and carbon atoms exceed respective upper limits of the above-mentioned ranges, the crystallinity of each layer deteriorates to such an extent that device characteristics deteriorate, which is not desirable.

Relationship Between Composition of Channel Layer and Device Characteristics

As described above, the channel layer 3 is formed as to satisfy the composition range where $x1=0$ and $0 \leq y1 \leq 0.3$, and in a case where the channel layer 3 is formed to contain a slight amount of Al (in a case where $y1>0$), the specific resistance thereof increases sharply while a drain leakage current during OFF reduces sharply. For example, in the case where $y1=0.01$ (where the channel layer 3 is $Al_{0.01}Ga_{0.99}N$), the specific resistance increases by approximately two orders while the drain leakage current reduces by approximately two orders, compared with the case where $y1=0$ (where the channel layer 3 is GaN). Further, in the case where $y1=0.1$ (where the channel layer 3 is $Al_{0.1}Ga_{0.9}N$), the specific resistance increases by approximately four orders while the drain leakage current reduces by approximately three orders, compared with the case where $y1=0$.

On the other hand, the mobility of two-dimensional electron gas hardly changes in the range where $0 \leq y1 \leq 0.1$. This is considered to result from the fact that the crystallinity of the channel layer does not deteriorate significantly along with an increase in AlN mole fraction and the fact that the mobility deterioration accompanying alloy diffusion (which occurs in a case of mixed crystal material) does not occur considerably due to a relatively small AlN mole fraction.

From the above, in a case where the channel layer 3 is formed so as to satisfy the composition range where $x1=0$ and $0.01 \leq y1 \leq 0.1$, there is achieved a HEMT device that has high mobility of two-dimensional electron gas and a small drain leakage current during OFF.

The mobility of two-dimensional electron gas starts decreasing in the range where $y1>0.1$, which changes more gradually compared with the specific resistance and the drain leakage current. On the other hand, the off-state breakdown voltage becomes larger as the value of $y1$ increases, and in the range where $y1>0.1$, the off-state breakdown voltage twice as large as the case where $y1=0$ or a larger off-state breakdown voltage is obtained. This is because the breakdown electric field increases along with an increase in bandgap of the channel layer 3.

As a result, when the channel layer 3 is formed so as to satisfy the composition range where $x1=0$ and $0.1y1 \leq 0.3$, there is achieved a HEMT device that has a small drain leakage current during OFF and has a high breakdown voltage.

Method of Manufacturing Epitaxial Substrate and HEMT Device

Next, description is given of the method of manufacturing the epitaxial substrate 10A in which the above-mentioned channel layer 3 and barrier layer 5 have the above-mentioned composition ranges and further manufacturing the HEMT device 10 using the epitaxial substrate 10A.

Note that the case where a large number of HEMT devices 10 are manufactured at the same time from one substrate 1 (in a case where a large number of pieces are manufactured) is described below.

The epitaxial substrate 10A can be manufactured with a known MOCVD reactor. Specifically, there is used an MOCVD reactor configured such that a reactor is capable of being supplied with a metal organic (MO) source gas (TMI, TMA and TMG) for In, Al and Ga, an ammonia gas, a hydrogen gas and a nitrogen gas.

First, for example, a 6H—SiC substrate that has (0001) plane orientation and a diameter of two inches is prepared as the substrate 1, and the substrate 1 is placed on a susceptor provided in the reactor of the MOCVD reactor. The inside of the reactor is replaced with vacuum gas, and then, an atmosphere in hydrogen/nitrogen mixed flow state is formed while maintaining a pressure inside the reactor at a predetermined value of 5 kPa to 50 kPa (for example, 30 kPa). After that, the temperature of the substrate is raised through susceptor heating.

When the susceptor temperature reaches a predetermined temperature of 950° C. to 1,250° C. (for example, 1,050° C.), which is a buffer layer forming temperature, Al source gas and $NH_3$ gas are introduced into the reactor, to thereby an AlN layer serving as the buffer layer 2.

After the AlN layer is formed, the susceptor temperature is maintained at a predetermined channel layer forming temperature T1 (° C.), and metal organic source gas and ammonia gas are introduced into the reactor in accordance with the composition of the channel layer 3, thereby forming an $In_{x1}Al_{y1}Ga_{z1}N$ layer (where $x1=0$, $0 \leq y1 \leq 0.3$) serving as the channel layer 3. Here, the channel layer forming temperature T1 is a value determined in the temperature range where 950° C. $\leq$ T1 $\leq$ 1,250° C. in accordance with a value of an AlN mole fraction $y1$ of the channel layer 3. Note that the pressure in reactor when forming the channel layer 3 is not particularly limited, and can be appropriately selected from the range of 10 kPa to an atmospheric pressure (100 kPa).

After the $In_{x1}Al_{y1}Ga_{z1}N$ layer is formed, next, the susceptor temperature is maintained at a predetermined barrier layer forming temperature T2 (° C.), and then a nitrogen gas atmosphere is formed in the reactor. Here, the barrier layer forming temperature T2 is determined in the range of 650° C. or more to 800° C. or less in accordance with the In composition ratio. In this case, the pressure in reactor is set to be maintained at a predetermined value of 1 kPa or more and 30 kPa or less (for example, 10 kPa). Note that in the case where the pressure in reactor is set to a predetermined value of 1 kPa to 20 kPa, the HEMT device 10 that has a small ohmic contact resistance and a small gate leakage current (excellent schottky contact characteristics) is achieved. This is the effect resulting from the increased surface flatness of the barrier layer 5 owing to a reduced pressure in reactor.

Next, ammonia gas and metal organic source gas that has a flow rate corresponding to the composition of the barrier layer 5 are introduced into the reactor such that a so-called V/III ratio takes a predetermined value of 3,000 or more and 20,000 or less, and then the $In_{x2}Al_{y2}Ga_{z2}N$ layer serving as the barrier layer 5 is formed to have a predetermined thickness. In that case, the $In_{x2}Al_{y2}Ga_{z2}N$ layer is formed so as to have the composition of $In_{x2\alpha}Al_{y2\alpha}Ga_{z2\alpha}N$ that satisfies Expressions (1) to (5), to have the gradient composition in the near-surface portion, and to have the composition of $In_{x2\beta}Al_{y2\beta}Ga_{z2\beta}N$ on the surface 5a. Note that the range of the growth rate of the barrier layer 5 is preferably 0.01 to 0.1 µm/h.

Note that in the case where the V/III ratio is a value in the range of 3,000 or more to 7,500 or less, the formation is made such that the interface I between the channel layer 3 and the barrier layer 5 has a mean roughness of 0.1 nm to 1 nm and the surface of the barrier layer 5 has a mean square roughness of 0.1 nm to 1 nm in a field of view of 5 µm×5 µm.

Note that the formation of the gradient composition portion is achieved by adjusting a flow rate of source gas in accordance with the gradient composition while maintaining the barrier layer forming temperature T2 constant. Alternatively, the formation thereof is also enabled by varying the barrier layer forming temperature T2 while maintaining the flow rate constant.

Further, in this preferred embodiment, nitrogen gas is used for bubbling gas formed of metal organic source and carrier gas in manufacturing the barrier layer 5. That is, the atmosphere gas other than source gas is only nitrogen gas. Accordingly, a nitrogen partial pressure in reactor increases, whereby the reaction between In and nitrogen can be caused to progress in a highly activated state even in a temperature range of 800° C. or less where the decomposition rate of an ammonia molecule is relatively low. As a result, even in a case where the barrier layer 5 is composed of a nitride containing In, it is possible to form the barrier layer 5 in a stable manner. Further, the electronic structure of the barrier layer 5 can be maintained in an ideal state, whereby the generation of two-dimensional electron gas is achieved at high concentration in the two-dimensional electron gas region 3e. Note that it is not preferable to intentionally mix hydrogen gas into the atmosphere in manufacturing the barrier layer 5 because this causes a decrease in concentration of two-dimensional electron gas.

Manufacturing of the epitaxial substrate 10A is completed after the formation of the barrier layer 5.

After the epitaxial substrate 10A is obtained, the HEMT device 10 is manufactured using this. Note that the steps thereafter are achieved by a known technique.

First, the device isolation step of removing portions that become boundaries between respective devices by etching so as to have a depth of approximately 400 nm by the photolithography process and the RIE method. This device isolation step is required for obtaining a large number of HEMT devices 10 from one epitaxial substrate 10A, which is not necessary for the present invention inherently.

After the device isolation step is performed, an $SiO_2$ film is formed on the epitaxial substrate 10A to have a predetermined thickness (for example, 10 nm), and then by the photolithography process, the $SiO_2$ film only in the positions where the source electrode 6 and the drain electrode 7 are to be formed is removed by etching, thereby forming an $SiO_2$ pattern layer.

After the formation of the $SiO_2$ pattern layer, the source electrode 6 and the drain electrode 7 formed of Ti/Al/Ni/Au are respectively formed in the expected formation positions thereof by the vacuum deposition method and the photolithography process. Then, in order to obtain excellent ohmic characteristics of the source electrode 6 and the drain electrode 7, heat treatment is performed for several tens of seconds (for example, 30 seconds) in the nitrogen gas atmosphere at a predetermined temperature of 650° C. to 1,000° C. (for example, 700° C.).

After the heat treatment, the $SiO_2$ film in the position where the gate electrode 8 is to be formed is removed from the $SiO_2$ pattern layer by the photolithography process, and then the gate electrode 8 formed of Pd/Au is formed in the expected formation position by the vacuum deposition method and the photolithography process. The gate electrode 8 is formed as a metal pattern having schottky characteristics.

Through the above-mentioned process, the HEMT device 10 is obtained.

According to this preferred embodiment, as described above, the barrier layer of the epitaxial substrate is caused to have the gradient composition in the near-surface portion, with the result that there is obtained a HEMT device whose ohmic contact characteristics between the barrier layer and the electrode being in ohmic contact therewith are improved compared with a conventional case. Specifically, the contact resistance is reduced to approximately a half of that of a conventional case by setting the grading rate x2β/x2α to 1.05 or more and 1.1 or less.

Further, the channel layer is foamed so as to satisfy the composition range of $In_{x1}Al_{y1}Ga_{z1}N$ (where x1+y1+z1=1, x1=0, 0≦y1≦0.3), and the epitaxial substrate is manufactured by determining the composition of the barrier layer so as to satisfy the composition range determined by Expressions (1) to (5), and accordingly with the use of the epitaxial substrate, there is achieved a HEMT device that has strains suppressed due to the internal stress and includes a two-dimensional electron gas region having a concentration of $2\times10^{13}/cm^2$ or more, which is higher compared with a conventional case. In particular, in the case where an epitaxial substrate is manufactured by determining a composition of a barrier layer so as to satisfy the composition range determined by Expressions (6) to (10), there is achieved a HEMT device in which a two-dimensional electron gas region having a concentration of $3\times10^{13}/cm^2$ or more is formed.

Second Preferred Embodiment

HEMT Device Including Spacer Layer

Figure 7:
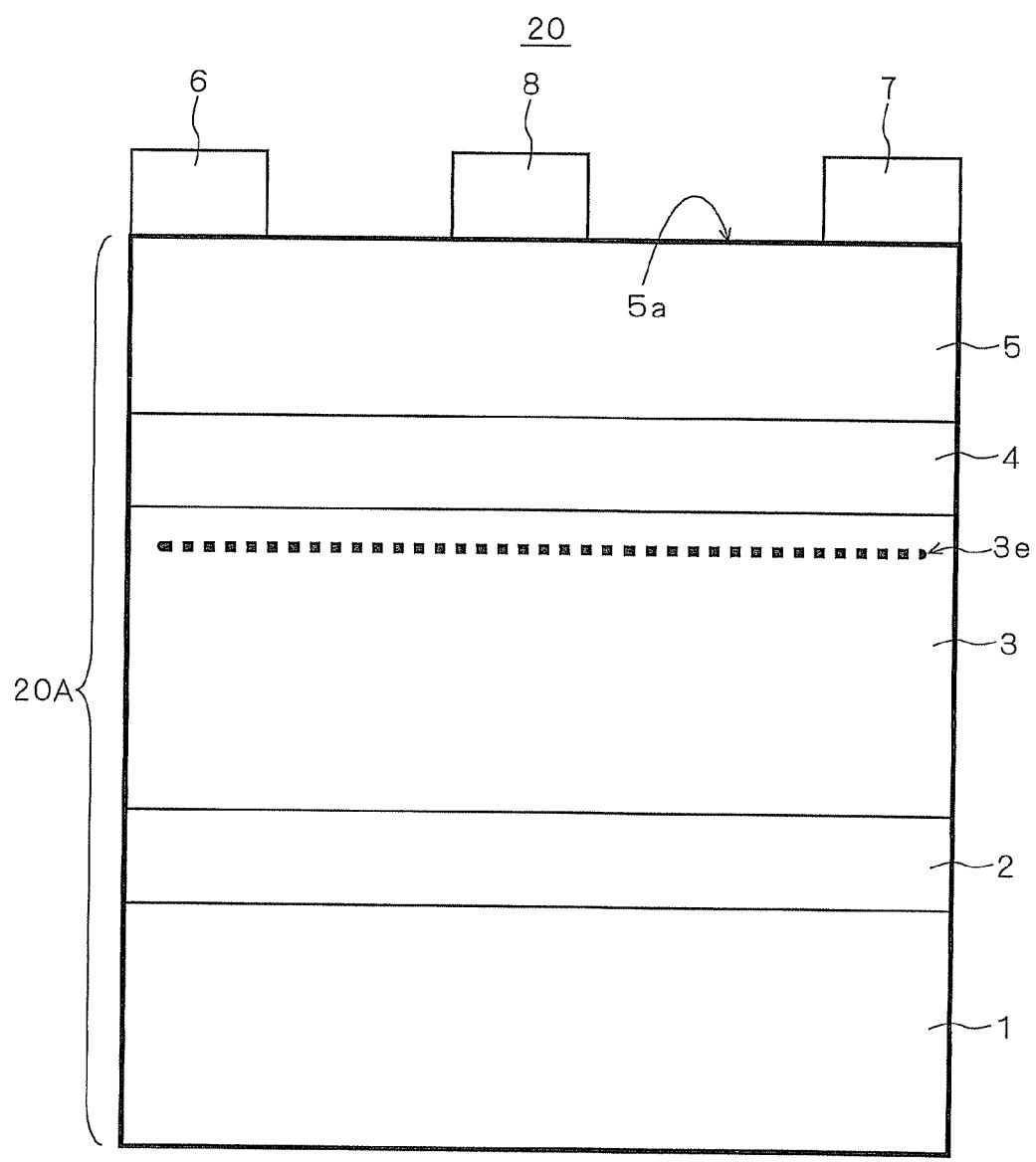
FIG. 7 is a schematic cross-sectional view schematically showing a configuration of a HEMT device according to a second preferred embodiment.

FIG. 7 is a schematic cross-sectional diagram schematically showing the configuration of a HEMT device 20 according to a second preferred embodiment of the present invention. The HEMT device 20 has the configuration in which a spacer layer 4 is interposed between the channel layer 3 and the barrier layer 5 of the HEMT device 10 according to the first preferred embodiment. Constituent elements other than the spacer layer 4 are the same as those of the HEMT device 10 according to the first preferred embodiment, and thus detailed description thereof is omitted. Note that the laminated structure in which the substrate 1, the buffer layer 2, the channel layer 3, the spacer layer 4 and the barrier layer 5 are formed by lamination is also referred to as an epitaxial substrate 20A.

The spacer layer 4 is formed of a group III nitride that has a composition of $In_{x3}Al_{y3}Ga_{z3}N$ (x3+y3+z3=1), contains at least Al, and has a bandgap equal to or larger than the barrier layer 5 so as to have a thickness in a range of 0.5 nm to 1.5 nm. For example, in a case where the spacer layer 4 is formed such that x3=0 and $0 \leq z3 \leq 0.2$, the spacer layer 4 that has a bandgap larger than any barrier layer 5 is formed. The spacer layer 4 is preferably formed such that x3=0 and $0 \leq z3 \leq 0.05$. In such a case, an alloy scattering effect is suppressed, and the concentration and mobility of two-dimensional electron gas are improved. The spacer layer 4 is more preferably formed of AlN (x3=0, y3=1, z3=0). In such a case, the spacer layer 4 is a binary compound of Al and N, and thus an alloy scattering effect is suppressed further compared with the case of a ternary compound containing Ga, with the result that the concentration and mobility of two-dimensional electron gas are improved.

Note that the discussion regarding the above-mentioned composition range does not exclude the fact that the spacer layer 4 contains impurities. For example, in the case where the channel layer 3 contains oxygen atoms or nitrogen atoms in the concentration range as described above, the spacer layer 4 may contain those in a similar concentration range as well.

As described above, in the HEMT device 20 including the spacer layer 4, the two-dimensional electron gas region 3e in which two-dimensional electron gas is present at high concentration is formed at the interface between the channel layer 3 and the spacer layer 4 (more specifically, in the portion in the vicinity of the interface of the channel layer 3). If the composition ranges of the channel layer 3 and the barrier layer 5 of the HEMT device 20 are determined in the same manner as the HEMT device 10 according to the first preferred embodiment, two-dimensional electron gas equal to that of the HEMT device 10 having the corresponding composition is generated also in the two-dimensional electron gas region 3e of the HEMT device 20.

Further, in the HEMT device 20 including the above-mentioned spacer layer 4, the mobility higher than that of the HEMT device 10 according to the first preferred embodiment is achieved. In the HEMT device 20, the mobility of approximately 1,000 to 1,400 cm²/Vs, which is three times larger than that of the HEMT device 10, is achieved.

Note that in a case where the spacer layer 4 is formed to have a thickness smaller than 0.5 nm, the layer is formed insufficiently, whereby the effect of confining two-dimensional electron gas is not obtained sufficiently. On the other hand, in a case where the spacer layer 4 is formed to have a thickness larger than 1.5 nm, the film quality of the spacer layer 4 itself is degraded due to the internal stress, and thus the above-mentioned high mobility cannot be obtained.

From the above, when the channel layer 3 is formed so as to satisfy the composition range where x1=0 and $0.01 \leq y1 \leq 0.1$, the HEMT device 20 that has high mobility of two-dimensional electron gas and a small drain leakage current during OFF is achieved. On the other hand, when the channel layer 3 is formed so as to satisfy the composition range where x1=0 and $0.1 \leq y1 \leq 0.3$, the HEMT device 20 that has a small drain leakage current during OFF and has a high breakdown voltage is achieved. Note that the above similarly holds true for the HEMT device 10 that does not include the spacer layer 4 as described above.

Also in the HEMT device 20 including the above-mentioned spacer layer 4, when the near-surface portion of the barrier layer 5 is formed so as to have a gradient composition in a range that satisfies $1.05 \leq x2\beta/x2\alpha \leq 1.1$, ohmic contact characteristics between the source electrode 6 or the drain electrode 7 and the barrier layer 5 can be made more excellent compared with a conventional case, as in the first preferred embodiment.

Manufacture of HEMT Device Including Spacer Layer

The HEMT device 20 having the above-mentioned structure is manufactured by a similar method to that of the HEMT device 10 according to the first preferred embodiment except for the process of forming the spacer layer 4.

Specifically, in manufacturing the epitaxial substrate 20A, the formation up to the channel layer 3 is performed, the susceptor temperature is set to a spacer layer forming temperature T3 (where T3 is approximately the same as T1), and the inside of the reactor is maintained at the nitrogen gas atmosphere. Then, the reactor pressure is set to 10 kPa, and metal organic source gas and ammonia gas are introduced into the reactor, thereby forming the $In_{x3}Al_{y3}Ga_{z3}N$ layer serving as the spacer layer 4 to have a predetermined thickness.

The spacer layer 4 is formed in this manner, and then the barrier layer 5 is manufactured in a similar procedure to that in the case of manufacturing the above-mentioned epitaxial substrate 10A.

Note that the channel layer forming temperature T1 is set in the range where $950° C. \leq T1 \leq 1,250° C.$, whereas the barrier layer forming temperature T2 is set in accordance with the InN mole fraction of the barrier layer 5 in the range where $650° C. \leq T2 \leq 800° C.$, as described above. In addition, the spacer layer forming temperature T3 (° C.) is set to be approximately the same as the channel layer forming temperature T1 (° C.) as well. Therefore, in order to form the barrier layer 5, the susceptor temperature needs to be lowered after the formation of the channel layer 3 or the spacer layer 4. In the course of manufacturing the HEMT device 10 according to the first preferred embodiment, which does not include the spacer layer 4, the surface of the channel layer 3 remains exposed while the temperature drops, and thus this surface may be etched by atmosphere gas. To the contrary, in the case where the spacer layer 4 is provided at the spacer layer forming temperature T3 that is approximately the same as the channel layer forming temperature T1 as in this preferred embodiment, the susceptor temperature is lowered after the formation of the spacer layer 4, whereby the spacer layer 4 acts as a protective layer of the surface of the channel layer 3. It is considered that the above also contributes to improvement in mobility of two-dimensional electron gas.

As described above, according to this preferred embodiment, in a HEMT device in which the compositions of a channel layer and a barrier layer are determined as in the HEMT device according to the first preferred embodiment, by providing a spacer layer between the channel layer and the barrier layer, it is possible to achieve a HEMT device that has improved mobility of two-dimensional electron gas while having a high two-dimensional electron gas concentration similar to that of the HEMT device according to the first preferred embodiment.

EXAMPLES

Inventive Example 1

In this inventive example, six types (samples No. 1 to No. 6) of epitaxial substrates that have different In composition distribution in the near-surface portion of the barrier layer were manufactured, and ohmic contact characteristics thereof were evaluated.

In manufacturing an epitaxial substrate, first, a plurality of 6H—SiC substrates that have (0001) plane orientation and a diameter of three inches were prepared as the substrate. Each of the substrates was placed in a reactor of an MOCVD reactor, and an inside of the reactor was replaced with vacuum gas. After that, a pressure inside the reactor was set to 30 kPa, thereby forming the atmosphere in hydrogen/nitrogen mixed flow state. Then, a temperature of the substrate was raised through susceptor heating.

When a susceptor temperature reached 1,050° C., Al source gas and ammonia gas were introduced into the reactor, to thereby form an AlN layer that serves as the buffer layer and has a thickness of 200 nm.

Then, the susceptor temperature was maintained at 1,080° C. that is the channel layer forming temperature T1 (° C.), and trimethylgallium (TMG) that is Ga source gas and ammonia gas were introduced into the reactor at a predetermined flow rate, to thereby form the GaN layer serving as the channel layer to have a thickness of 2 μm.

After the channel layer was obtained, the reactor pressure was set to 10 kPa while keeping the susceptor temperature, and then trimethylaluminum (TMA) as the Al source gas and ammonium gas were introduced into the reactor, to thereby form the AlN layer serving as the spacer layer 4 to have a thickness of 1.2 nm.

After the formation of the spacer layer, the susceptor temperature was maintained at 800° C. that is the barrier layer forming temperature T2 (° C.), and the reactor pressure was set to 10 kPa after the formation of the nitrogen atmosphere in the reactor. Then, TMA, trimethylindium (TMI) that is IN source gas, and ammonia gas were introduced into the reactor at a predetermined flow rate, to thereby start the formation of the barrier layer so as to have the composition of $In_{0.16}Al_{0.84}N$. As to the samples other than No. 5, the flow rate of TMA and TMI was changed at the time when the thickness of the barrier layer reached approximately 8 nm, and the near-surface portion of the barrier layer was caused to have a gradient composition. In the respective samples, a barrier layer having a thickness of 16 nm was formed.

Note that nitrogen gas was used for bubbling gas of metal organic source and carrier gas. The V/III ratio was set to 5,000.

After the formation of the barrier layer 5, the susceptor temperature was lowered to approximately room temperature, and the reactor was made open to the atmosphere. Then, the manufactured epitaxial substrate was taken out.

Figure 8:
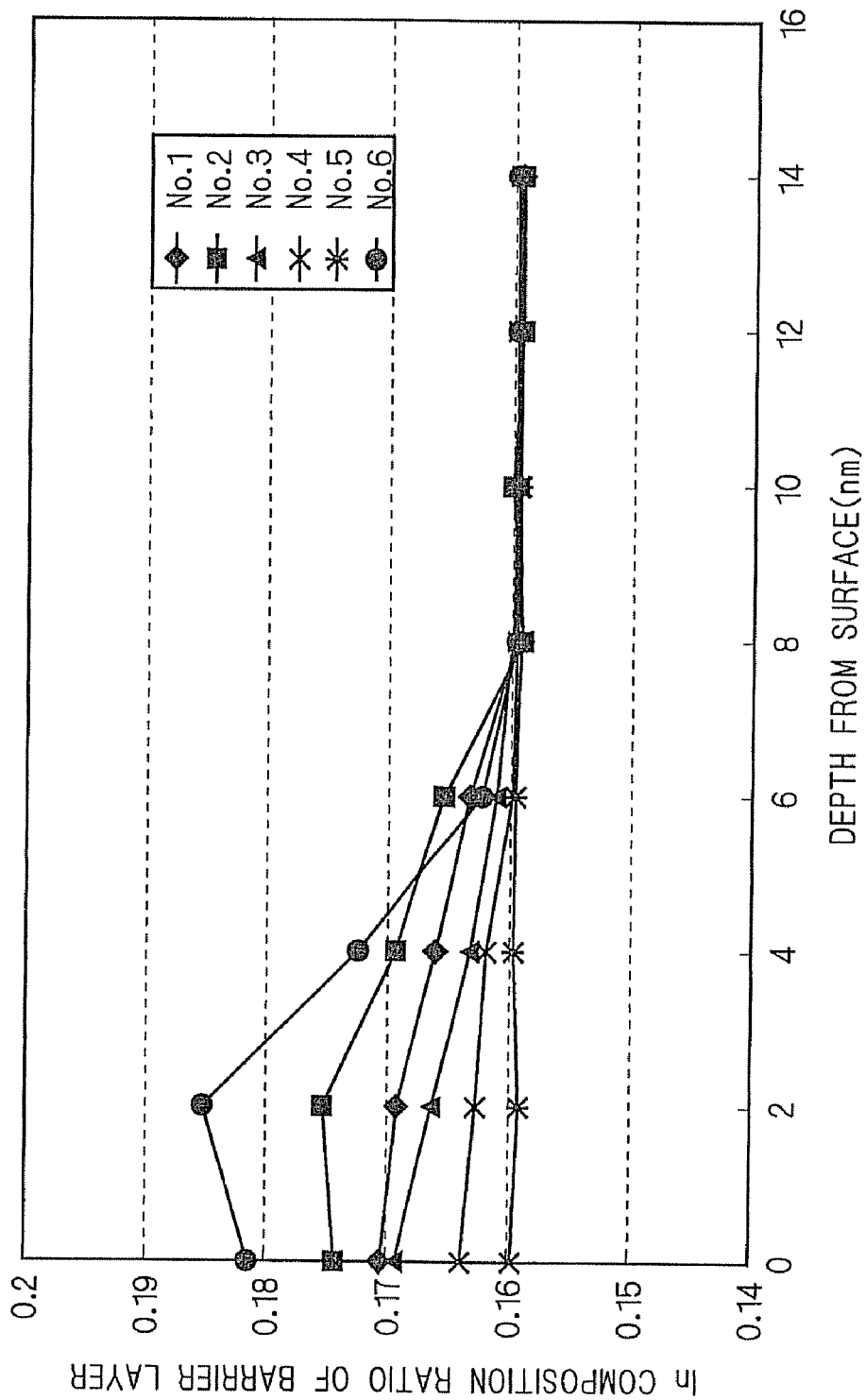
FIG. 8 is a distribution chart of In composition ratios in barrier layers of respective samples according to Inventive Example 1.

As to the obtained six types of samples, the distribution of In composition ratio of the barrier layer was evaluated with a cross sectional transmission electron microscope (TEM) and an energy dispersive X-ray spectroscopy (EDS). FIG. 8 shows the distribution of In composition ratios in the barrier layers in the respective samples according to first preferred embodiment, which were obtained by the evaluations.

Next, ohmic contact characteristics of six types of epitaxial substrates were examined by the transmission line measurement (TLM) method. On this occasion, as an ohmic electrode, a metal layer formed of Ti/Al/Ni/Au (film thickness thereof is 25/75/15/100 nm) was formed on the epitaxial substrates. Further, in order to make ohmic contact characteristics excellent, the epitaxial substrate after the formation of electrodes was subjected to heat treatment for 30 seconds in the nitrogen gas atmosphere at 700° C.

FIG. 9 shows a list of evaluation results of ohmic contact characteristics of the respective samples.

As shown in FIG. 9, it was confirmed that a low contact resistance can be obtained in the range where the grading rate $x2\beta/x2\alpha$ is 1.05 or more. On the other hand, it was also confirmed that the sheet resistance of the epitaxial substrate becomes high in the case where the grading rate $x2\beta/x2\alpha$ is larger than 1.1. That is, it was confirmed that the sheet resistance and the contact resistance are both suppressed in a case where $1.05 \times x2\beta/x2\alpha \leq 1.1$.

Inventive Example 2 and Comparative Example

As Inventive Example 2, seventeen types of epitaxial substrates were manufactured in total, each of which has a different composition in the base portion of the barrier layer but have the grading rate fixed to 1.05. Further, as Comparative Example, seventeen types of epitaxial substrates were manufactured in total correspondingly to Inventive Example 2, which do not have a gradient composition in the near-surface portion and have the same composition as that of the base portion. Contact resistances of the respective samples were evaluated.

As to the samples according to Inventive Example 2, the range where the portion is apart from the surface of the barrier layer by 0 nm to 6 nm was the gradient composition range and the In composition ratio was made to increase monotonically toward the surface. The gradient composition was achieved by adjusting a flow rate among TMG, TMA and TMI that are the source gas.

Further, the epitaxial substrate was manufactured and the contact resistance was measured as in Inventive Example 1.

FIG. 10 shows a list of the compositions (also compositions of entire barrier layers of samples according to Comparative Example) of the base portions of the barrier layers of the samples according to Inventive Example 2 and measurement results of the contact resistances of the samples according to Inventive Example 2 as well as Comparative Example corresponding thereto.

It was confirmed from FIG. 10 that irrespective of the composition of the base portion of the barrier layer, the contact resistance becomes smaller to approximately a half of that of Comparative Example in all epitaxial substrates according to Inventive Example 2.

While the invention has been shown and described in detail, the foregoing description is in all aspects illustrative and not restrictive. It is therefore understood that numerous modifications and variations can be devised without departing from the scope of the invention.

What is claimed is:

1. An epitaxial substrate for semiconductor device, comprising:
    a base substrate;
    a channel layer formed of a first group III nitride containing at least Al and Ga and having a composition of $In_{x1}Al_{y1}Ga_{z1}N$ (x1+y1+z1=1); and
    a barrier layer including a near-surface portion and a base portion, the barrier layer being formed of a second group III nitride containing at least In and Al and having a composition of $In_{x2}Al_{y2}Ga_{z2}N$ (x2+y2+z2=1), wherein:
    said near-surface portion is a portion positioned in a predetermined distance range from a surface of said barrier layer;
    said base portion is a portion of said barrier layer other than said near-surface portion; and
    an In composition ratio of the surface of said barrier layer is larger than an In composition ratio of said base portion.

2. The epitaxial substrate for semiconductor device according to claim 1, wherein:
    said near-surface portion is positioned in a range of 6 nm or more from the surface of said barrier layer in a depth direction; and
    $1.05 \leq x2\beta/x2\alpha \leq 1.1$ where the composition of said second group III nitride in said base portion is represented by $In_{x2\alpha}Al_{y2\alpha}Ga_{z2\alpha}N$ (x2α+y2α+z2α=1) and the composition of said second group III nitride in said near-surface portion is represented by $In_{x2\beta}Al_{y2\beta}Ga_{z2\beta}N$ (x2β+y2β+z2β=1).

3. The epitaxial substrate for semiconductor device according to claim 1, wherein:
    the composition of said first group III nitride is in a range determined by x1=0 and $0 \leq y1 \leq 0.3$; and the composition of said second group III nitride is, in a ternary phase diagram with InN, AlN and GaN being vertices, in a range surrounded by straight lines respectively represented by the following expressions determined in accordance with the composition of said first group III nitride:

$$x2 = \frac{y2-(0.36+0.5y1)}{1.78} = -\frac{z2-(0.64-0.5y1)}{2.78};$$

$$x2 = \frac{y2-(0.45+y1)}{4.5} = -\frac{z2-(0.55-y1)}{5.5};$$

$$x2 = -\frac{y2-(0.9-0.7y1)}{4.5} = \frac{z2-(0.1+0.7y1)}{3.5};$$

$$z2 = 0; \text{ and}$$

$$x2 = 0 \left(\text{where } \frac{9}{34} \leq y1 \leq 0.3\right).$$

4. The epitaxial substrate for semiconductor device according to claim 3, wherein the composition of said second group III nitride is, in a ternary phase diagram with InN, AlN and GaN being vertices, in a range surrounded by straight lines respectively represented by the following expressions determined in accordance with the composition of said first group III nitride:

$$x2 = \frac{y2-(0.5+0.5y1)}{1.78} = -\frac{z2-(0.5-0.5y1)}{2.78};$$

$$x2 = \frac{y2-(0.45+y1)}{4.5} = -\frac{z2-(0.55-y1)}{5.5};$$

$$x2 = -\frac{y2-(0.9-0.7y1)}{4.5} = \frac{z2-(0.1+0.7y1)}{3.5};$$

$$z2 = 0; \text{ and}$$

$$x2 = 0 \left(\text{where } \frac{9}{34} \leq y1 \leq 0.3\right).$$

5. The epitaxial substrate for semiconductor device according to claim 1, wherein said first group III nitride is GaN.

6. The epitaxial substrate for semiconductor device according to claim 1, further comprising:
a spacer layer formed of a third group III nitride having a composition of $In_{x3}Al_{y3}Ga_{z3}N$ (x3+y3+z3=1), said spacer layer being formed between said channel layer and said barrier layer, containing at least Al, and having larger bandgap energy compared with said barrier layer.

7. The epitaxial substrate for semiconductor device according to claim 6, wherein the composition of said third group III nitride is in a range determined by x3=0 and 0≦z3≦0.05.

8. The epitaxial substrate for semiconductor device according to claim 7, wherein said third group III nitride is AlN.

9. A semiconductor device, comprising:
an epitaxial substrate comprising:
a base substrate;
a channel layer formed of a first group III nitride containing at least Al and Ga and having a composition of $In_{x1}Al_{y1}Ga_{z1}N$ (x1+y1+z1=1); and
a barrier layer including a near-surface portion and a base portion, the barrier layer being formed of a second group III nitride containing at least In and Al and having a composition of $In_{x2}Al_{y2}Ga_{z2}N$ (x2+y2+z2=1); and
a source electrode, a drain electrode and a gate electrode provided on said barrier layer of said epitaxial substrate, wherein:
said near-surface portion is a portion positioned in a predetermined distance range from a surface of said barrier layer;
said base portion is a portion of said barrier layer other than said near-surface portion; and
an In composition ratio of the surface of said barrier layer is larger than an In composition ratio of said base portion.

10. A method of manufacturing an epitaxial substrate for semiconductor device, comprising the steps of:
a) forming a channel layer of a first group III nitride on a base substrate, the first group III nitride containing at least Al and Ga and having a composition of $In_{x1}Al_{y1}Ga_{z1}N$ (x1+y1+z1=1); and
b) forming a barrier layer including a near-surface portion and a base portion of a second group III nitride on said channel layer, the second group III nitride containing at least In and Al and having a composition of $In_{x2}Al_{y2}Ga_{z2}N$ (x2+y2+z2=1), wherein:
said near-surface portion is a portion positioned in a predetermined distance range from a surface of said barrier layer;
said base portion is a portion of said barrier layer other than said near-surface portion; and
said barrier layer is formed so that an In composition ratio of the surface of said barrier layer is larger than an In composition ratio of said base portion in said step b).

11. The method of manufacturing an epitaxial substrate for semiconductor device according to claim 10, wherein:
said near-surface portion is formed in a range of 6 nm or more from the surface of said barrier layer in a depth direction; and
said barrier layer is formed so as to satisfy 1.05≦x2β/x2α≦1.1 where the composition of said second group III nitride in said base portion is represented by $In_{x2\alpha}Al_{y2\alpha}Ga_{z2\alpha}N$ (x2α+y2α+z2α=1) and the composition of said second group III nitride in said near-surface portion is represented by $In_{x2\beta}Al_{y2\beta}Ga_{z2\beta}N$ (x2β+y2β+z2β=1).

12. The method of manufacturing an epitaxial substrate for semiconductor device according to claim 10, wherein:
the composition of said first group III nitride is selected from a range determined by x1=0 and 0≦y1≦0.3; and
the composition of said second group III nitride is selected, in a ternary phase diagram with InN, AlN and GaN being vertices, from a range surrounded by straight lines respectively represented by the following expressions determined in accordance with the composition of said first group III nitride:

$$x2 = \frac{y2-(0.36+0.5y1)}{1.78} = -\frac{z2-(0.64-0.5y1)}{2.78};$$

$$x2 = \frac{y2-(0.45+y1)}{4.5} = -\frac{z2-(0.55-y1)}{5.5};$$

$$x2 = -\frac{y2-(0.9-0.7y1)}{4.5} = \frac{z2-(0.1+0.7y1)}{3.5};$$

$$z2 = 0; \text{ and}$$

$$x2 = 0 \left(\text{where } \frac{9}{34} \leq y1 \leq 0.3\right).$$

13. The method of manufacturing an epitaxial substrate for semiconductor device according to claim 10, further comprising the step of:
c) forming a spacer layer of a third group III nitride having a composition of $In_{x3}Al_{y3}Ga_{z3}N$ (x3+y3+z3=1) on said barrier layer, wherein:
said spacer layer contains at least Al and has larger bandgap energy compared with said barrier layer; and
said barrier layer is formed on said spacer layer.

* * * * *